United States Patent
Asam et al.

(10) Patent No.: US 8,624,637 B2
(45) Date of Patent: Jan. 7, 2014

(54) SWITCHING CONTROL CIRCUIT FOR THERMAL PROTECTION OF TRANSISTORS

(75) Inventors: Michael Asam, Sainbach (DE); Carmelo Fabio Giunta, Munich (DE); Wolfgang Horchler, Rosenheim (DE); Markus Winkler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/369,092

(22) Filed: Feb. 8, 2012

(65) Prior Publication Data

US 2013/0200927 A1   Aug. 8, 2013

(51) Int. Cl.
*H03B 1/00* (2006.01)
*H03K 17/687* (2006.01)

(52) U.S. Cl.
USPC .......................................... 327/108; 327/434

(58) Field of Classification Search
USPC .................. 327/427, 108, 112, 365, 436, 434
See application file for complete search history.

(56) References Cited

U.S. PATENT DOCUMENTS

| | | | | |
|---|---|---|---|---|
| 5,422,593 A | * | 6/1995 | Fujihira | 327/561 |
| 5,557,223 A | * | 9/1996 | Kuo | 327/108 |
| 6,181,186 B1 | * | 1/2001 | Itoh et al. | 327/309 |
| 7,158,359 B2 | * | 1/2007 | Bertele et al. | 361/93.9 |
| 7,242,238 B2 | * | 7/2007 | Higashi | 327/427 |

* cited by examiner

*Primary Examiner* — Hai L Nguyen
(74) *Attorney, Agent, or Firm* — Slater & Matsil, L.L.P.

(57) ABSTRACT

A circuit for controlling the switching operation of a transistor is described. A gate driver circuit is operably connected to a control electrode of the transistor and is configured to charge and discharge the control electrode to switch the transistor on and off, respectively, in accordance with a control signal. The charging and discharging of the control electrode is done such that the corresponding transitions in the load current and the output voltage are smooth with a defined slope. A controllable switch is connected to the control electrode such that, when the switch closes, the control electrode is quickly discharged via the switch thus quickly switching off the transistor. A control logic circuit is configured to close the controllable switch for switching off the transistor when at least one of a number of conditions holds true.

18 Claims, 3 Drawing Sheets

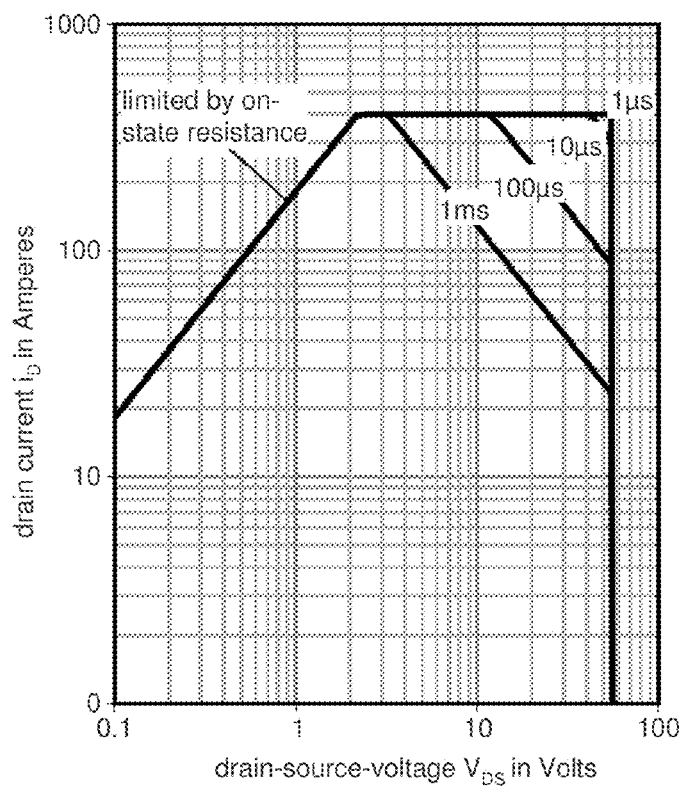
FIG. 3
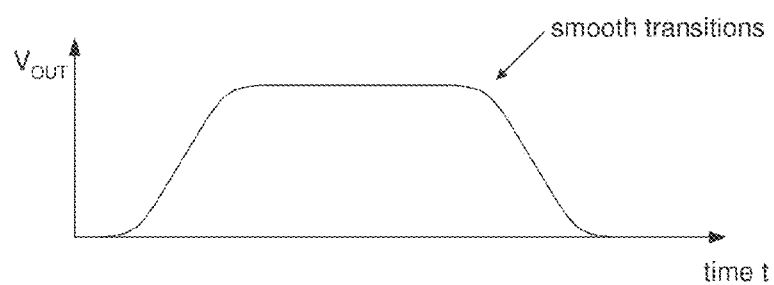
FIG. 4    effect of edge shaping

SWITCHING CONTROL CIRCUIT FOR THERMAL PROTECTION OF TRANSISTORS

TECHNICAL FIELD

The invention relates to a control circuit and a corresponding method for controlling the switching operation of a transistor to ensure an over-temperature protection in some specific states of operation of the transistor, particularly to control circuits and corresponding methods which ensure a shut-down of a transistor in thermally unstable operating states.

BACKGROUND

The requirement of keeping electromagnetic interferences (EMI) low and providing a sufficient electromagnetic compatibility (EMC) control circuits for controlling the switching operation of switching transistors (e.g., MOSFETs) are often designed to avoid abrupt changes of the transistor load current (i.e., the drain current in case of a MOSFET) as well as of the corresponding voltage drop (i.e., drain-source-voltage in case of a MOSFET) across the transistor. When switching the load current on and off the resulting load current gradient should not to be too steep so as to avoid high frequency signal components present in the resulting current waveform. Such a behavior of the control circuit and the respective control method is often referred to as "edge shaping."

However, a slow and smooth switching of the load current results in higher switching losses which are generally undesired and thus a conflict of design goals exists. Higher switching losses usually lead to higher chip temperatures in the silicon body in which the semiconductor switch is integrated. As the electric behavior of a transistor is, in general, temperature dependent, an increasing chip temperature may, under certain operating conditions, eventually lead to even higher currents and correspondingly higher losses and thus to thermally unstable operation states. Current filamentation, the formation of "hot spots" within the semiconductor body, and a general degradation or even destruction of the semiconductor switch may be the result of such thermally unstable operating states.

In view of the above there is a need for a control circuit and a respective method for controlling the switching operation of a semiconductor switch which helps to avoid thermally unstable operation states of the semiconductor switch while keeping electromagnetic interferences (EMI) low during normal operation states.

SUMMARY OF THE INVENTION

A circuit for controlling the switching operation of a field effect transistor is described. The field effect transistor has a gate electrode, a first load terminal operably connected to a first supply potential, and a second load terminal operably connected to an electric load for providing an output voltage and for supplying a load current to the load. In accordance with a first example of the invention the circuit comprises a gate driver circuit operably connected to the gate electrode and configured to charge and discharge the gate electrode to switch the transistor on and off, respectively, in accordance with a control signal, wherein the charging and discharging of the gate electrode is done such that the corresponding transitions in the load current and the output voltage are smooth with a defined slope. The circuit further comprises a controllable switch connected to the gate electrode such that, when the switch closes, the gate is quickly discharged via the switch thus quickly switching off the transistor. Furthermore, the circuit comprises a control logic circuit which is configured to close the controllable switch for switching off the transistor when at least one of the following conditions holds true: (1) the output voltage becomes negative; (2) the total power dissipated in the transistor is higher than a given power limit; (3) the load current is higher than a first current threshold; (4) the transistor operates in a state in which the load current has a positive temperature coefficient and the load current exceeds a second current threshold; and (5) the transistor operates in a state in which the load current has a positive temperature coefficient and the voltage drop across the load current path of the transistor exceeds a voltage threshold.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 3 illustrates in a diagram the maximum allowable values of the drain current and the corresponding drain-source-voltage of a MOSFET for different time intervals;

FIG. 4 illustrates in a timing diagram the desired waveform of the output voltage across the load so as to achieve low EMI when switching a resistive load;

DETAILED DESCRIPTION OF ILLUSTRATIVE EMBODIMENTS

Figure 1:
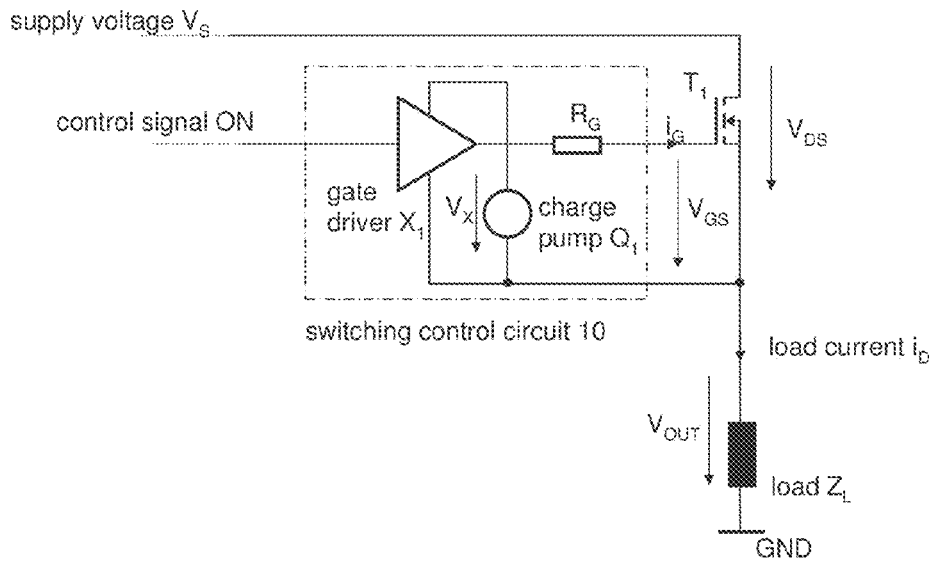
FIG. 1 illustrates a circuit including a high-side semiconductor switch as well as a switching control circuit which is configured to drive the semiconductor switch into an on or an off state in accordance with a control signal.

FIG. 1 illustrates a circuit for switching an electric load $Z_L$ which may have a resistive as well as a reactive component. The circuit includes a high-side semiconductor switch $T_1$ which is an n-channel MOSFET in the present example. However, p-channel MOSFETs may be used instead as well as corresponding IGBTs. Further, the principles described herein can readily be applied to circuits using low-side semiconductor switches instead of the high-side switches used in the examples described herein.

A switching control circuit 10 is connected to the control electrode (i.e., the gate electrode) of the transistor $T_1$. The switching control circuit 10 is usually configured to charge and discharge the gate of the transistor $T_1$ in accordance with a binary control signal ON to switch the transistor into an on-state or an off-state dependent on the logic level of control signal ON. In the present example ON=1 means that the transistor $T_1$ is switched on whereas ON=0 means that the transistor $T_1$ is switched off. As the transistor $T_1$ is a high-side transistor the transistor is connected between the load and an upper supply potential $V_S$ whereas the load $Z_L$ is connected between the transistor $T_1$ and a reference potential, e.g., ground potential GND. The load current corresponds to the drain current $i_D$ of the transistor $T_1$, the voltage drop across the load $Z_L$ is denoted as output voltage $V_{OUT}$. The voltage drop across the load current path (drain-source-path) of the transistor $T_1$ is denoted as drain-source voltage $V_{DS}$, whereby $V_S=V_{DS}+V_{OUT}$. As mentioned above, the gate of the transistor $T_1$ is charged and discharged by the control circuit 10 and the resulting gate-source voltage (gate-emitter voltage in case of an IGBT) is denoted as $V_{GS}$.

In a simple embodiment the switching control circuit 10 includes a gate driver $X_1$ which receives the binary control signal ON and provides a corresponding gate current $i_G$ or a corresponding gate-source voltage $V_{GS}$. When the control signal ON changes from 0 to 1 the resulting gate-source voltage $V_{GS}$ changes from a low level (e.g., 0 V) to a high level (e.g., 4.5 V). The transition from the low level and the high level is usually designed to follow a defined characteristic in order to achieve a certain switching behavior. For example, the transistor is usually switched on slowly to achieve a smooth transition in the output voltage and the load current so as to comply with certain requirements such as low electromagnetic emissions (EMI). A well defined switching behavior is usually required to ensure the electromagnetic compatibility (EMC) of the overall switching circuit. One easy way to gradually charge and discharge the transistor gate is to connect a resistor between the gate driver output and the actual gate electrode of the transistor. Such a resistor is often referred to as "gate resistor" and it limits the gate current $i_G$ to a maximum value which depends on the resistance value.

As in the present example the transistor $T_1$ is an n-channel transistor, the switching control circuit 10 is a floating circuit and the gate driver $X_1$ has to be supplied by a floating supply circuit which may be, e.g., a charge pump, a bootstrap circuit or similar circuits known in the art which fulfill the same purpose.

Figure 2:
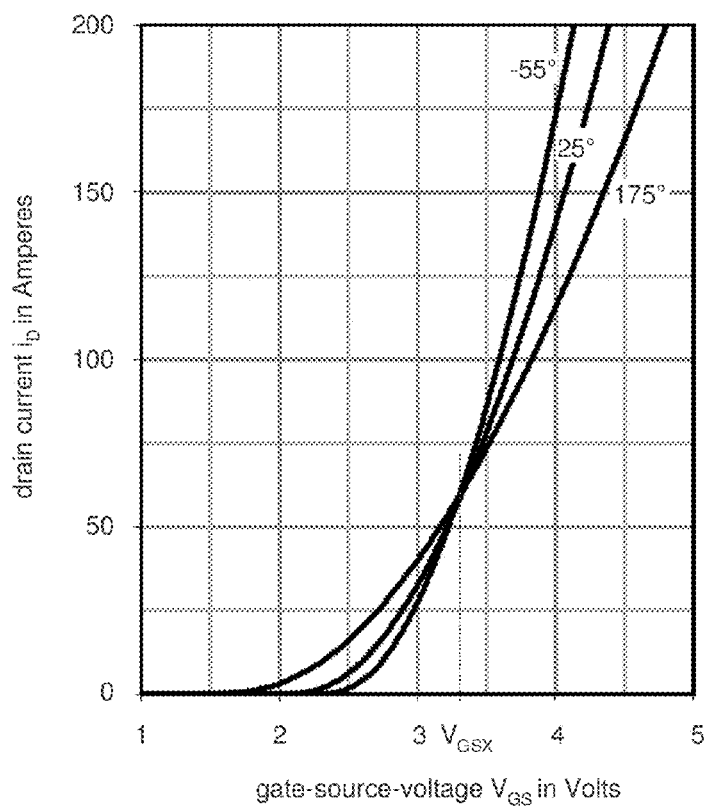
FIG. 2 is a diagram illustrating the relationship between the gate-source-voltage of a MOSFET and the respective drain current for different chip temperatures.

FIG. 2 is a diagram illustrating the relation between the gate-source-voltage $V_{GS}$ of a MOSFET and the respective drain current $i_D$ for different chip temperatures of the silicon body. It is notable that the drain current $i_D$ has a positive temperature coefficient for gate-source voltages $V_{GS}$ below a "temperature-stable point" (approximately $V_{GSX}=3.3$ V in the present example) and a negative temperature coefficient for gate-source voltages $V_{GS}$ above the temperature-stable point. The gate-source voltage associated with the temperature-stable point is denoted as $V_{GSX}$. One result of this fact is that, at low gate-source-voltages $V_{GS}$ below the temperature stable point (i.e., $V_{GS}<V_{GSX}$), the transistor exhibits an unstable temperature behavior as an increasing temperature leads to an increasing drain current $i_D$ which, again, leads to an even more (locally) increasing temperature. Such an unstable behavior may eventually lead to current filamentation in the semiconductor body and the degradation of the semiconductor switch (reduced life-time, etc.).

Modern transistors which have a low on-resistance usually have their temperature stable point at relatively high gate-source voltages $V_{GS}$. When switching the transistor off smoothly the gate-source voltage $V_{GS}$ falls below the temperature-stable point and the transistor operates in an unstable state in which hot-spots may occur in the semiconductor body, the temperature-distribution becomes inhomogeneous giving rise to current filamentation which may eventually lead to the destruction of the transistor.

In order to avoid overheating transistor datasheets usually specify maximum values of the drain current and the corresponding drain-source voltage $V_{DS}$ as the total power dissipated in the transistor is the product $i_D V_{DS}$. An exemplary diagram illustrating the four different time intervals is depicted in FIG. 3. The drain current may reach the 1 ms-limit for a time span of only 1 ms, the 100 µs-limit for a time span of only 100 µs, etc. In view of this, one might be tempted to assume that discharging the transistor's gate quickly is good in order to stop the drain current flow quickly for reducing the energy dissipated during one switching cycle. However, an abrupt discharging of the gate entails a very steep load current and output voltage gradients which are detrimental to the EMC of the overall circuit. To fulfill the usual EMC requirements a "smooth switching" is usually desired. FIG. 4 illustrates one example of the output voltage $V_{OUT}$ during one switching cycle. A well-defined voltage gradient (slew rate) and smooth transitions are a common design goal to reduce the generation of high frequency signal components. Particularly when switching off inductive loads this smooth switching may lead to the thermal unstable states as mentioned above.

Figure 5:
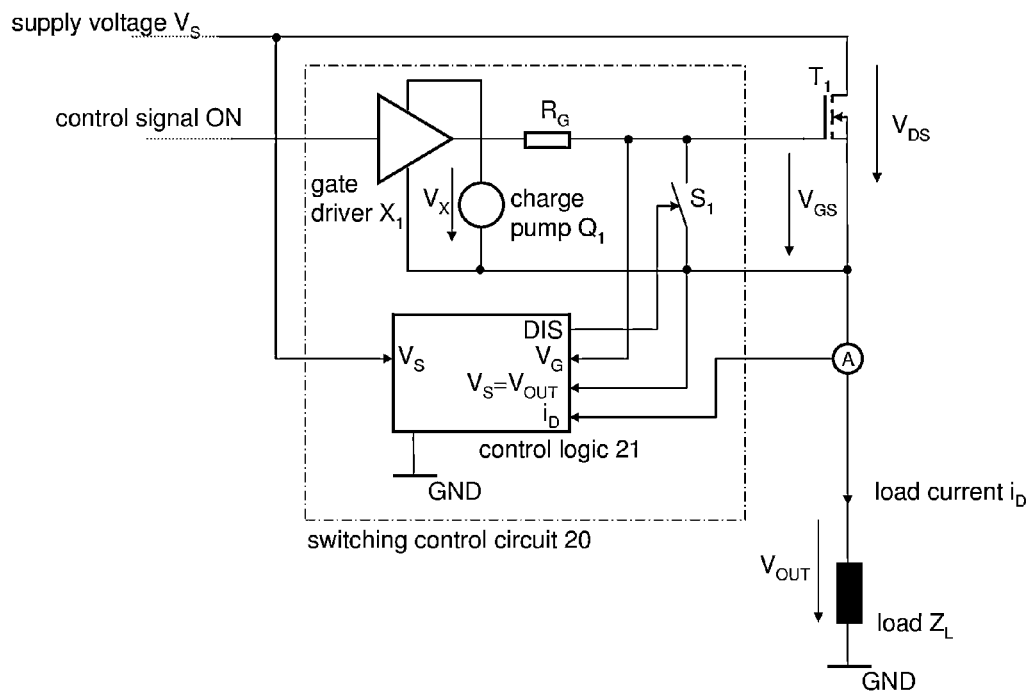
FIG. 5 illustrates the circuit with an improved switching control circuit.

The improved circuit of FIG. 5 provides a smooth switching and low EMI during normal operation so as to achieve the EMC goals whereas in thermally unstable conditions a fast switch-off is enforced. The example of FIG. 5 includes all the components of the example presented in FIG. 1. Compared to the example of FIG. 1, the present example additionally includes a controllable switch $S_1$ coupled to the transistor $T_1$ such that closing the switch completely discharges the gate (to be precise: the gate-source capacitance) and thus abruptly forces the transistor T1 into its off-state. The switching control circuit 20 of the present example includes (as compared to the circuit 10 depicted in FIG. 1) a control logic circuitry 21 configured to activate the switch $S_1$ when the transistor $T_1$ begins to operate in a thermally unstable state. Furthermore, the control logic 21 is configured to detect such a thermally unstable state by observing at least one of the following signals: the output voltage $V_{OUT}$, the load current $i_D$, the gate-source voltage $V_{GS}=V_G-V_{OUT}$, and the drain-source voltage $V_{DS}=V_S-V_{OUT}$. A detected thermally unstable state is signaled by setting the binary signal DIS provided by the control logic 21 to a logic level appropriate to close the switch $S_1$ for quickly discharging the gate-source capacitance of the transistor $T_1$.

Figure 6:
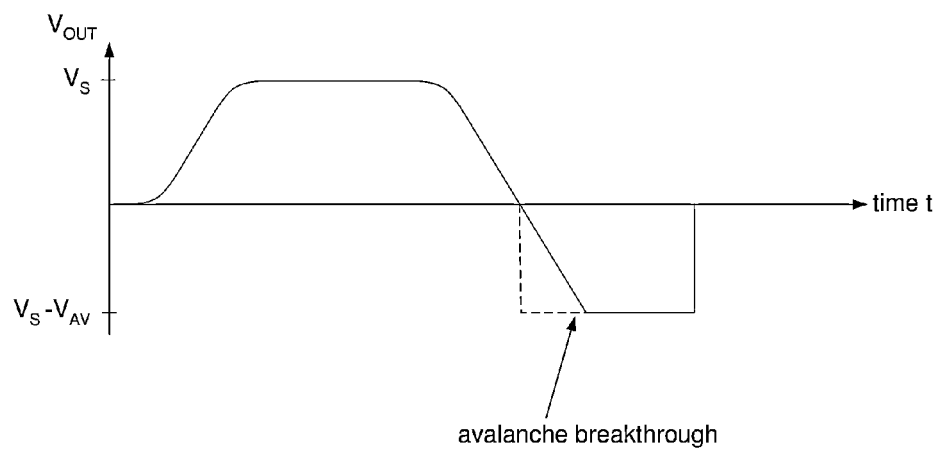
FIG. 6 illustrates in a timing diagram the desired waveform of the output voltage across the load when switching an inductive load.

The criteria according to which a thermally unstable state is detected and according to which the switch $S_1$ is closed are discussed below. The first situation where an unstable state may occur is when switching off a load $Z_L$ which has a significant inductive component (i.e., an inductive load). In that case the output voltage does not smoothly drop to zero as illustrated in the timing diagram of FIG. 4, but rather becomes negative as indicated by the solid line of the timing diagram of FIG. 6 which illustrates the course of the output voltage $V_{OUT}$ across an inductive load $Z_L$ during one switching cycle. When switching the transistor $T_1$ off (e.g., triggered by a transition of the control signal ON from ON=1 to ON=0) the output voltage $V_{OUT}$ falls from a level equaling almost the supply voltage $V_S$ down to negative values until reaching the negative level $V_S-V_{AV}$ (thus $V_{AV}>V_S$) wherein the voltage $V_{AV}$ is the maximum avalanche breakdown voltage across the transistor's drain-source path during the phase of avalanche breakthrough.

In situations in which the output voltage $V_{OUT}$ is negative (i.e., when $V_{OUT}<0$) it is important that the MOS channel is no longer conductive as drain current $i_D$ flowing through the channel at relatively high drain-source voltages cause high losses and, as a result, the thermally unstable states mentioned above. To resolve the problem the switch $S_1$ is closed as soon as a negative output voltage is detected. As a consequence, the MOS channel of transistor $T_1$ is not any more conductive and the avalanche breakdown phase starts immediately after the switch-off of the MOS channel. In this case the output voltage $V_{OUT}$ follows the dashed line depicted in FIG. 6. During the avalanche breakthrough phase the power dissipation is still high but, however, thermal instabilities (e.g., hot-spots and current filamentation) cannot occur as the avalanche breakthrough voltage has a positive temperature coefficient. Consequently, a thermal unstable state is detected when the inequation $V_{OUT}<0$ is valid. As a consequence the discharge signal DIS is set to a logic level which triggers the switch-on of the switch $S_1$ and, as a result, a switch-off of the MOS channel of the transistor $T_1$.

The second situation where an unstable state may occur is when the load current $i_D$ (drain current) exceeds a definable nominal value $i_{NOM}$, i.e., when the inequation $i_{D>iNOM}$ is valid. Such a situation usually occurs in the case when the load has a very low resistance due to a defect. In this situation a fast switch-off of the MOS channel is not only necessary to avoid the thermal instabilities mentioned above but generally to reduce the thermal energy due to switching losses and thus protect the switch from degradation.

The third situation where an unstable state may occur is when, during switch-off of the transistor $T_1$, the actual gate-source voltage $V_{GS}$ is lower than the voltage $V_{GSX}$ at the temperature-stable point and the actual drain current $i_D$ of the transistor $T_1$ simultaneously exceeds a critical value $i_{CRIT}$ which is a definable current threshold. That is, the control logic circuitry 21 is configured to evaluate the inequations $V_{GS}<V_{GSX}$ and $i_D>i_{CRIT}$ and to trigger a fast switch-off of the transistor $T_1$ (by closing the switch $S_1$ as mentioned above) when both inequations are evaluated to be true. In this case a fast switch-off of the transistor $T_1$ avoids excessive heat generation due to switching losses.

The fourth situation where an unstable state may occur is when, during switch-off of the transistor $T_1$, the actual gate-source voltage $V_{GS}$ is lower than the voltage $V_{GSX}$ at the temperature-stable point and the actual drain-source voltage $V_{DS}$ across the transistor $T_1$ simultaneously exceeds a critical value $V_{OUT}$ which is a definable voltage threshold. That is, the control logic circuitry 21 is configured to evaluate the inequations $V_{GS}<V_{GSX}$ and $V_{DS}>V_{CRIT}$ and to trigger a fast switch-off of the transistor $T_1$ (by closing the switch $S_1$ as mentioned above) when both inequations are evaluated to be true. In this case a fast switch-off of the transistor $T_1$ also avoids excessive heat generation due to switching losses.

The fifth situation where an unstable state may occur is when the actual power dissipation calculated as $P_{DISS}=i_DV_{DS}$ exceeds a definable maximum power $P_{MAX}$. That is, the control logic circuitry 21 is configured to calculate the actual power $i_DV_{DS}$ dissipated in the transistor $T_1$, to evaluate the inequation $i_DV_{DS}>P_{MAX}$, and to trigger a fast switch-off of the transistor $T_1$ (by closing the switch $S_1$ as mentioned above) when the inequation is evaluated to be true.

In order to be able to perform the above described functions the control logic 21 receives the required signals, e.g., a measured signal representative of the drain current $i_D$, and signals representing the output voltage $V_{OUT}$ (i.e., the source voltage), the gate potential $V_G$ and the supply voltage $V_S$. The inequations may be evaluated using comparators. However, the signals may also be digitized and the required calculations and operations may be performed by a microcontroller executing appropriate software.

It should be noted that the discharge signal DIS may be latched using, e.g., a SR-latch which can be reset by an external reset signal. In this case one output of the SR-latch can also be used to signal an alert to an external controller, which may also provide the mentioned reset signal. Five conditions have been described which may trigger an abrupt discharge of the gate of the field effect transistor $T_1$ by closing the switch $S_1$. As an option the discharge signal DIS may only be latched when triggered due to a positive evaluation of one or some of the mentioned conditions while the signal is not latched when triggered due to a positive evaluation of one of the remaining conditions.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A circuit for controlling the switching operation of a transistor having a control electrode, a first load terminal operably coupled to a first supply potential, a second load terminal operably coupled to an electric load for providing an output voltage and for supplying a load current to the load and a current path between the first and second load terminals, the circuit comprising:
   a driver circuit operably coupled to the control electrode and configured to charge and discharge the control electrode to switch the transistor on and off, respectively, in accordance with a control signal, the charging and discharging of the control electrode being such that corresponding transitions in the load current and the output voltage are smooth with a defined slope;
   a controllable switch coupled to the control electrode such that, when the switch closes, the control electrode is quickly discharged via the switch thus switching off the transistor with a slope steeper than the defined slope; and
   a control logic circuit configured to close the controllable switch for switching off the transistor when at least one of the following conditions holds true:
   (1) the output voltage becomes negative;
   (2) a total power dissipated in the transistor is higher than a given power limit;
   (3) the load current is higher than a first current threshold;
   (4) the load current has a positive temperature coefficient and the load current exceeds a second current threshold; and/or
   (5) the load current has a positive temperature coefficient and a voltage drop across the load current path of the transistor exceeds a voltage threshold.

2. The circuit of claim 1, wherein, the control logic circuit is configured to re-open the controllable switch not before a reset signal indicates to do so.

3. The circuit of claim 1, wherein the control logic circuit is configured to re-open the controllable switch not before a pre-defined time span has elapsed.

4. The circuit of claim 1, wherein the transistor is a field effect transistor.

5. The circuit of claim 4, wherein the field effect transistor is a high-side transistor and the electric load is coupled between the second load terminal of the field effect transistor and a ground potential.

6. The circuit of claim 4, wherein the first supply potential is a ground potential and wherein the field effect transistor is a low-side transistor, the electric load being coupled between the second load terminal of the field effect transistor and an upper supply potential that is higher than the ground potential.

7. The circuit of claim 4, wherein the driver circuit is configured to charge and discharge the control electrode via a gate resistor to limit a gate current to a maximum gate current value.

8. The circuit of claim 4, wherein the controllable switch is coupled between the control electrode and a source terminal of the field effect transistor to allow short-circuiting of a gate-source capacitance of the field effect transistor.

9. The circuit of claim 1, wherein the driver circuit is configured to charge the control electrode by supplying a positive current to the control electrode and wherein the driver circuit is configured to discharge the control electrode by supplying a negative current to the control electrode.

10. The circuit of claim 1, further comprising a current measurement circuit configured to provide a signal representative of the load current provided by the transistor.

11. The circuit of claim 1, wherein the control logic circuit is configured to determine whether a gate-source voltage of the transistor is lower than the voltage threshold, determine whether a drain current of the transistor exceeds the second current threshold, and close the controllable switch when the gate-source voltage is lower than the voltage threshold and the drain current exceeds the second current threshold.

12. The circuit of claim 1, wherein the control logic circuit is configured to close the controllable switch when the load current has a positive temperature coefficient and the voltage drop across the load current path of the transistor exceeds the voltage threshold.

13. A method for controlling a switching operation of a field effect transistor having a gate electrode, a first load terminal operably coupled to a first supply potential, a second load terminal operably coupled to an electric load for providing an output voltage and for supplying a load current to the load and a current path between the first and second load terminals, the method comprising:
   charging and discharging the gate electrode to switch the field effect transistor on and off, respectively, in accordance with a control signal, the charging and discharging of the gate electrode being such that corresponding transitions in the load current and the output voltage are smooth with a defined slope;
   abruptly discharging the gate electrode thereby switching off the field effect transistor with a slope steeper than the defined slope, wherein the abrupt discharging of the gate electrode is triggered when at least one of the following conditions holds true:
   (1) the output voltage becomes negative;
   (2) a total power dissipated in the field effect transistor is higher than a given power limit;
   (3) the load current is higher than a first current threshold;
   (4) the load current has a positive temperature coefficient and the load current exceeds a second current threshold; and/or
   (5) the load current has a positive temperature coefficient and a voltage drop across the load current path of the transistor exceeds a voltage threshold.

14. The method of claim 13, wherein the abrupt discharging of the gate electrode is triggered only when the control signal indicates a switch-off of the field effect transistor.

15. The method of claim 13, wherein the abrupt discharging of the gate electrode comprises closing a controllable switch coupled to the gate electrode such that, when the controllable switch closes, the abrupt discharging is triggered.

16. The method of claim 13, wherein an alert is signaled when the abrupt discharging of the gate electrode is triggered.

17. The method of claim 13, wherein abruptly discharging the gate electrode comprises:
   determining whether a gate-source voltage of the field effect transistor is lower than the voltage threshold and a drain current of the field effect transistor exceeds the second current threshold; and
   closing a switch when the gate-source voltage is lower than the voltage threshold and the drain current exceeds the second current threshold.

18. The circuit of claim 13, wherein abruptly discharging the gate electrode comprises:
   determining whether the load current has a positive temperature coefficient and the voltage drop across the load current path of the transistor exceeds the voltage threshold; and
   closing a switch when the load current has a positive temperature coefficient and the voltage drop across the load current path of the transistor exceeds the voltage threshold.

* * * * *